(12) United States Patent
Shimizume

(10) Patent No.: US 6,762,442 B2
(45) Date of Patent: Jul. 13, 2004

(54) SEMICONDUCTOR DEVICE CARRYING A PLURALITY OF CIRCUITS

(75) Inventor: Kazutoshi Shimizume, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/073,134

(22) Filed: Feb. 11, 2002

(65) Prior Publication Data

US 2002/0117688 A1 Aug. 29, 2002

(30) Foreign Application Priority Data

Feb. 14, 2001 (JP) ...................................... P2001-036757

(51) Int. Cl.⁷ .................. H01L 27/10; H01L 27/082
(52) U.S. Cl. .................. 257/203; 257/204; 257/209; 257/529; 327/525
(58) Field of Search .................. 257/202, 203, 257/204, 209, 529; 327/525; 438/128, 129; 307/480, 443, 479, 482.1; 395/551; 713/400

(56) References Cited

U.S. PATENT DOCUMENTS 5,566,107 A * 10/1996 Gilliam ...................... 365/200
5,867,691 A * 2/1999 Shiraishi ...................... 713/400
6,446,249 B1 * 9/2002 Wang et al. .................. 716/17

FOREIGN PATENT DOCUMENTS

JP         2001-168284         * 6/2001

* cited by examiner

*Primary Examiner*—Minhloan Tran
*Assistant Examiner*—Tan Tran
(74) *Attorney, Agent, or Firm*—Sonnenschein, Nath & Rosenthal LLP

(57) ABSTRACT

A semiconductor device includes on the same chip at least an I/O region where an input/output pad is formed and active regions where a circuit can be mounted, where a plurality of logic circuits having the same functions or different functions are mounted in the active regions on the same chip.

5 Claims, 5 Drawing Sheets

SEMICONDUCTOR DEVICE CARRYING A PLURALITY OF CIRCUITS

CROSS REFERENCES TO RELATED APPLICATIONS

The present invention claims priority to priority document no. 2001-036757 filed in Japan on Feb. 14, 2001, and incorporated by reference herein.

BACKGROUND OF THE INVENTION

1. Field of the Invention

The present invention relates to a semiconductor device that has a plurality of circuits mounted on one chip and each of the circuits having the same or different function.

2. Description of the Related Art

As shown in FIG. 5, a semiconductor chip 20 forming part of a semiconductor device is broadly divided into an active region 21 which is a region for embodying functions as a circuit, and an I/O (Input/Output) region 23 provided with input terminals and output terminals required for interfacing the circuit with an external circuit.

The I/O region 23 is formed in the periphery of the semiconductor chip 20, where a plurality of input/output pads 22 are provided as electrodes for connecting lead-out terminals for an LSI (Large Scale Integration) with the circuit inside the semiconductor chip through bonding wires.

Each of the input/output pads 22 is typically square shaped having sides approximately 100 $\mu$m in length. Due to limitations of mechanical accuracy of a bonding apparatus for use in a wire bonding process, it is difficult to significantly reduce the input/output pads 22 in size. Thus, when the required number of input/output pads 22 are arranged in the periphery of the rectangular chip 20 as shown in FIG. 5, the minimum chip size is accordingly determined.

In the chip sized as described above, the active region 21 surrounded by the I/O region 23 is a region where circuits can be actually placed. When circuits designed to fit in the active region 21 are placed, the circuits are formed aver the entire active region 21.

With an increasingly miniaturized LSI, a higher speed processing ability, and realization of an extremely large-scale integrated circuit in a very limited area on a chip, however, the overall active region 21 may not be filled with circuits. In this case, the active region 21 includes a no-patterned region which has no circuit mounted therein. A no-patterned region may also occur for circuits that involve relatively simple signal processing and uses a small number of gates.

On the other hand, the size of the active region 21 is inevitably determined by the number of the input/output pads 22 and the size thereof, i.e. pad size. Since improvement in mechanical accuracy of a bonding apparatus does not catch up with improvement in integration degree, it is impossible to reduce the size of the active region 21 according to the scale of the mounted circuits.

For circuits that do not require high speed processing, occurrence of a no-patterned region can be avoided by lowering its integration degree. For circuits that require high speed processing, however, a higher integration degree (miniaturization) is needed, and in this case, design must be performed in preparation for occurrence of a no-patterned region. In addition, when a no-patterned region occurs, a problem of too much waste arises since the no-patterned region cannot be effectively utilized.

In this manner, in a conventional LSI, since the minimum chip size is inevitably determined by the number and size of the input/output pads, a problem of a no-patterned region created in an active region surrounded by an I/O region arises in a highly integrated circuit or a circuit with a small number of gates. Thus, there are challenges of solving such a problem and improving the yield of a semiconductor device.

SUMMARY OF THE INVENTION

The present invention provides, as a specific means for addressing the aforementioned challenges, a semiconductor device comprising on the same chip at least an I/O region where an input/output pad is formed and an active region where a plurality of circuits can be mounted, wherein a plurality of logic circuits having the same functions or different functions are mounted in the active region on the same chip.

In the semiconductor device thus configured, a no-patterned region having no circuit mounted therein is utilized in the active region where circuits can be mounted, and a plurality of logic circuits having functions identical to or different from those of logic circuits mounted in the remaining active region are mounted in the no-patterned region. Consequently, the device can be shipped as a product if at least one of the logic circuits operates normally to significantly improve and more effectively utilize the semiconductor device.

In addition, when the plurality of mounted circuits are different from one other and if some of the circuits do not operate normally, the device can be delivered as an LSI having the functions of the other circuits operating normally. If all the circuits operate normally, the device can be delivered as one product having different functions to provide various applications.

Furthermore, when the plurality of circuits have the same functions and all of them operate normally, the device can be delivered as a semiconductor product having a plurality of logic circuits with the same functions mounted thereon, and thus all the circuits can be effectively utilized with appropriate design of peripheral circuits.

DESCRIPTION OF THE PREFERRED EMBODIMENTS

A semiconductor device formed with a semiconductor chip 10 shown in FIG. 1 will be described as an embodiment of the present invention. In the semiconductor chip 10, an active region 11 comprises a P-type semiconductor or N-type semiconductor substrate and this is a region where circuits can be mounted, and in addition, this region is an inside region surrounded by an I/O region 12.

Arranged in the I/O region 12 are a plurality of input/output pads 14 which are electrodes for connecting lead-out terminals for a logic LSI with a circuit inside the semiconductor chip through bonding wire. Each of the input/output pads 14 is a square shaped having sides approximately 100 μm in length.

Figure 1:
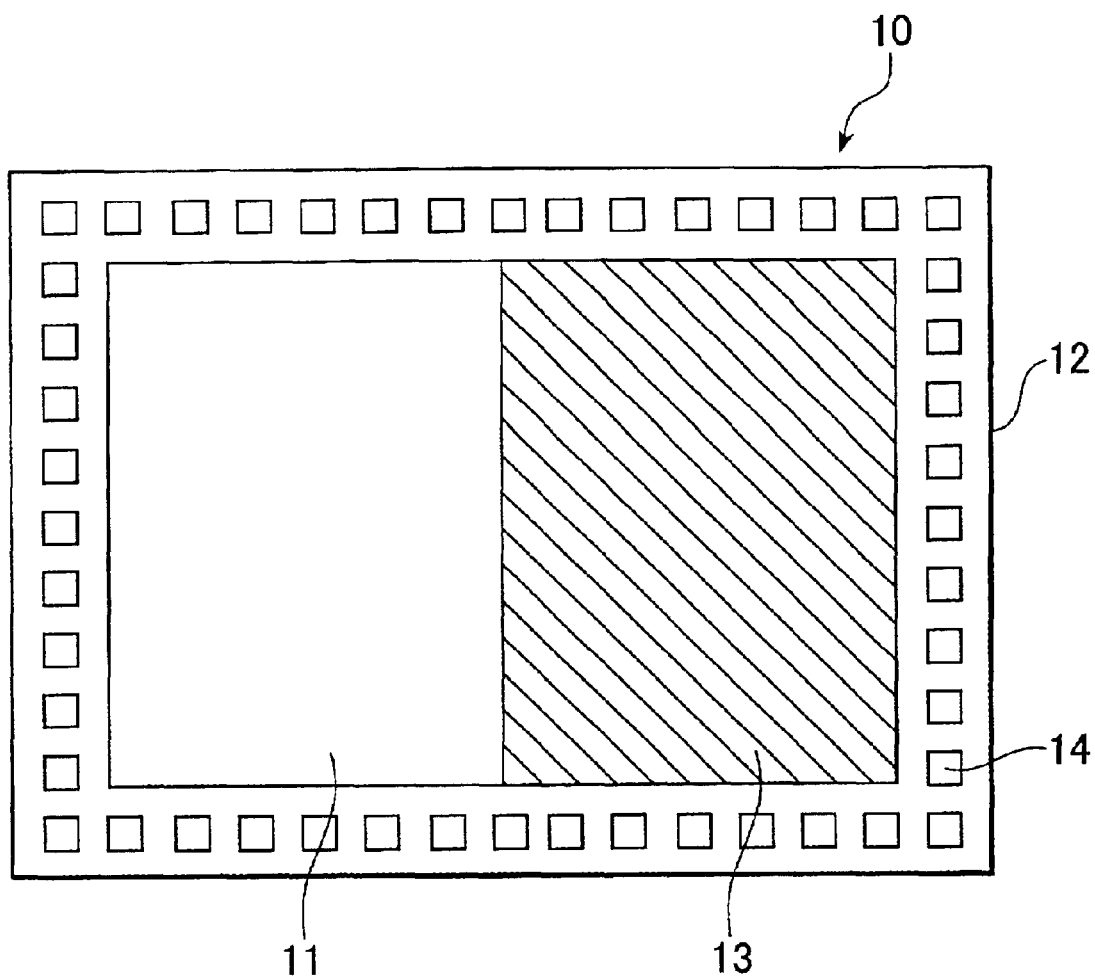
FIG. 1 is a diagram for explaining a semiconductor chip forming part of a semiconductor device to which the present invention is applied.

A hatched portion in FIG. 1 is a no-patterned region 13 where no circuit is mounted only one logic circuit block is mounted in the active region 11 surrounded by the I/O region 12.

Since recent LSIs have been increasingly miniaturized, higher speed processing is allowed, and an extremely large-scale integrated circuit can be realized in a very limited area on a chip, such a large no-patterned region is often created. In the example shown, the no-patterned region 13 occupies more than half of the active region 11.

Figure 2:
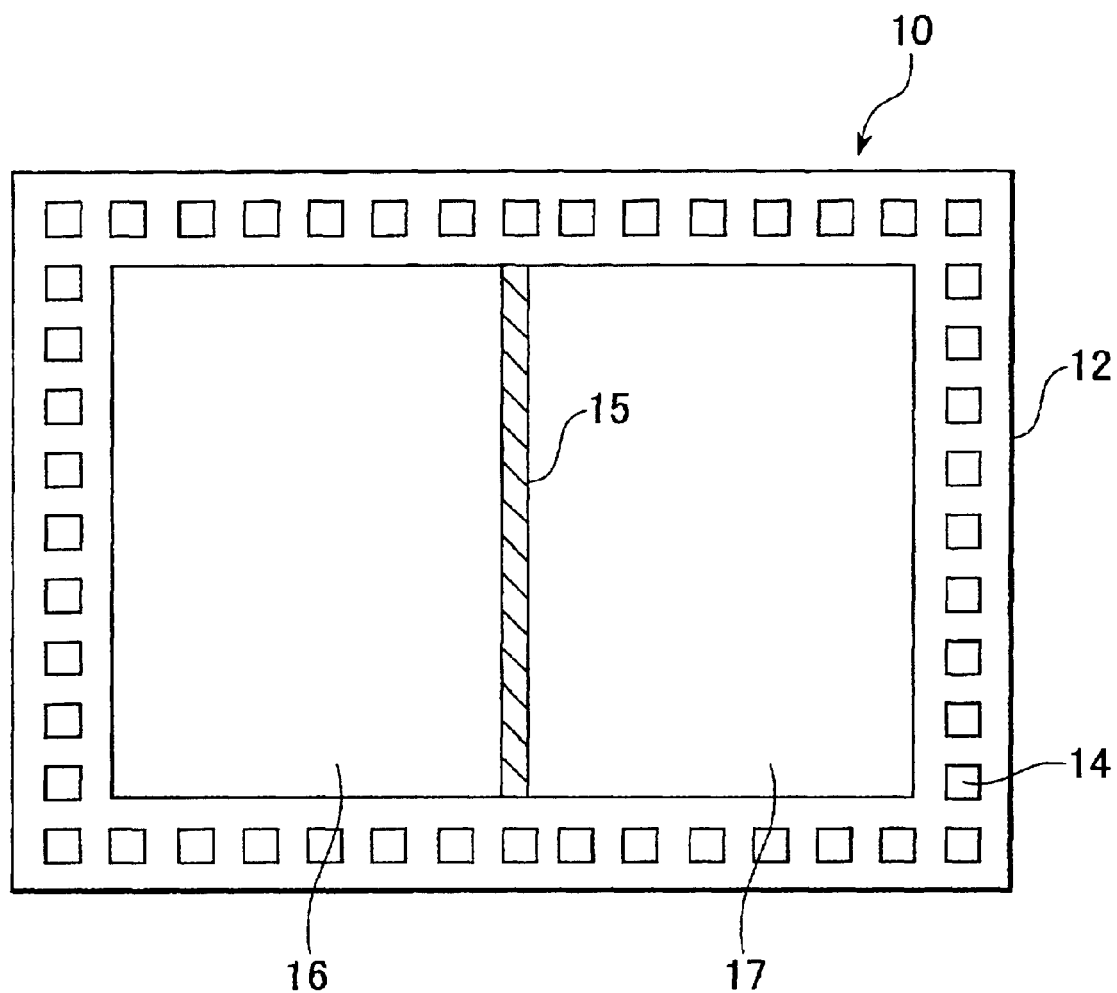
FIG. 2 is a diagram for explaining two active regions formed on the semiconductor chip.

As shown in FIG. 2, a portion of the no-patterned region shown in FIG. 1 is defined as a boundary region 15, and regions on both sides of the boundary region 15 are defined as a first active region 16 and a second active region 17, respectively. In the second active region 17, circuits having the same functions as, or circuits having different functions from, circuits mounted in the first active region 16, are mounted. It should be noted that the area of the first active region 16 may or may not be equal to the area of the second active region 17.

Figure 3:
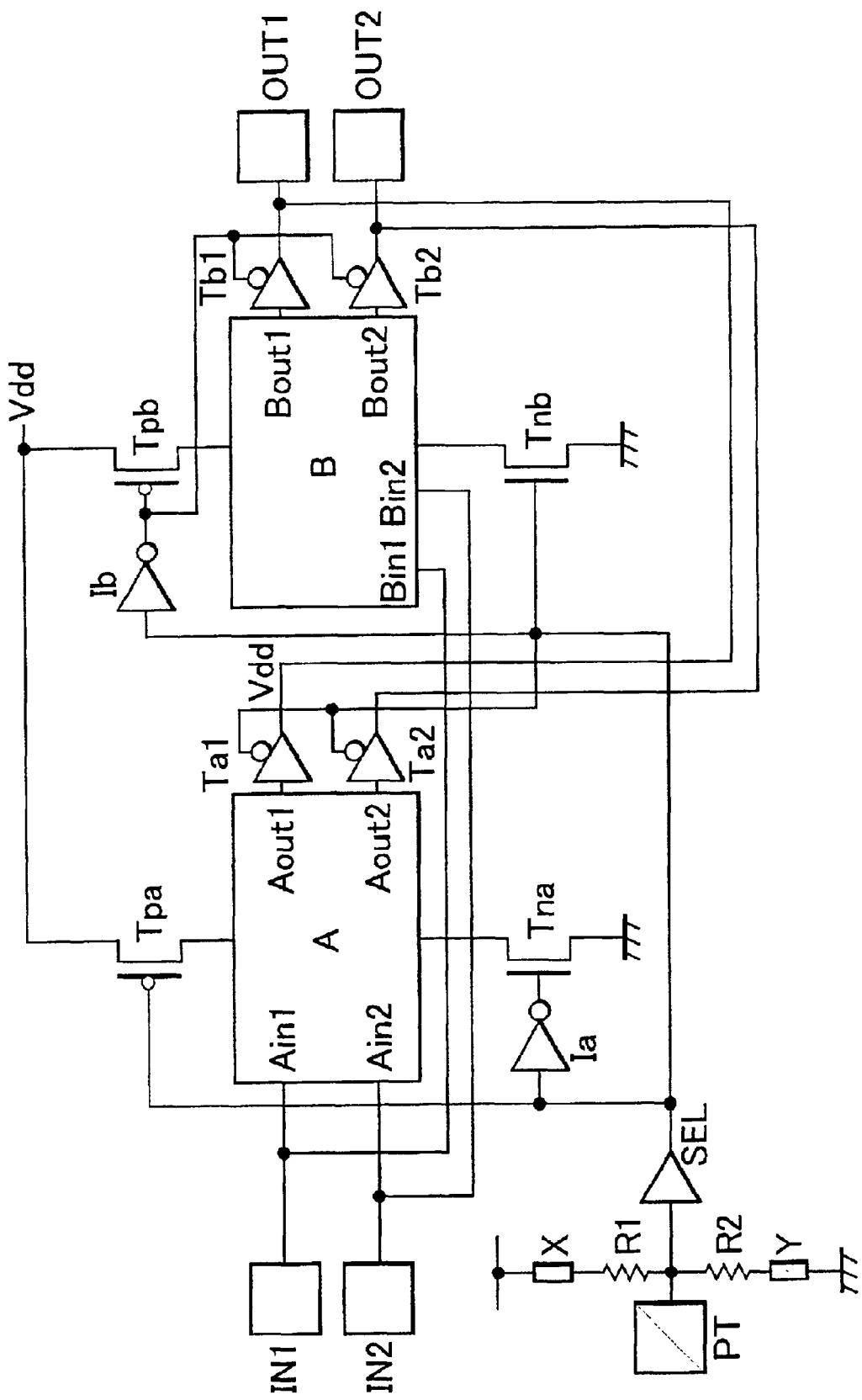
FIG. 3 is a circuit diagram showing circuits mounted on the semiconductor chip.

As shown in FIG. 3, a circuit block mounted in the first active region 16 is defined as a block A, while a circuit block mounted in the second active region 17 is defined as a block B. Each of the block A and block B may be a functional block including a plurality of circuits or a primitive cell which is the minimum unit of a circuit. The block A and block B may include circuits having the same functions or circuits having different functions from each other.

In FIG. 3, devices other than the block A and block B and signal lines form a selection circuit for operating the block A or block B and are mounted on the semiconductor chip 10.

The block A and block B are circuits which operate by connecting their GND terminals to the ground and their $V_{dd}$ terminals to $V_{dd}$. The block A is configured such that the GND terminal is connected to the ground when an N-channel transistor $T_{na}$ is turned on, and the $V_{dd}$ terminal is connected to $V_{dd}$ when a P-channel transistor $T_{pa}$ is turned on. Similarly, the block B is configured such that the GND terminal is connected to the ground when an N-channel transistor $T_{nb}$ is turned on, and the $V_{dd}$ terminal is connected to $V_{dd}$ when a P-channel transistor $T_{pb}$ is turned on.

The block A and block B are circuits which operate by connecting their GND terminals to the ground and their $V_{dd}$ terminals to $V_{dd}$. The block A is configured such that the GND terminal is connected to the ground when an N-channel transistor $T_{na}$ is turned on, and the $V_{dd}$ terminal is connected to $V_{dd}$ when a P-channel transistor $T_{pa}$ is turned on. On the other hand, the block B is configured such that the GND terminal is connected to the ground when an N-channel transistor $T_{nb}$ is turned on, and the $V_{dd}$ terminal is connected to $V_{dd}$ when a P-channel transistor $T_{pb}$ is turned on.

Figure 4:
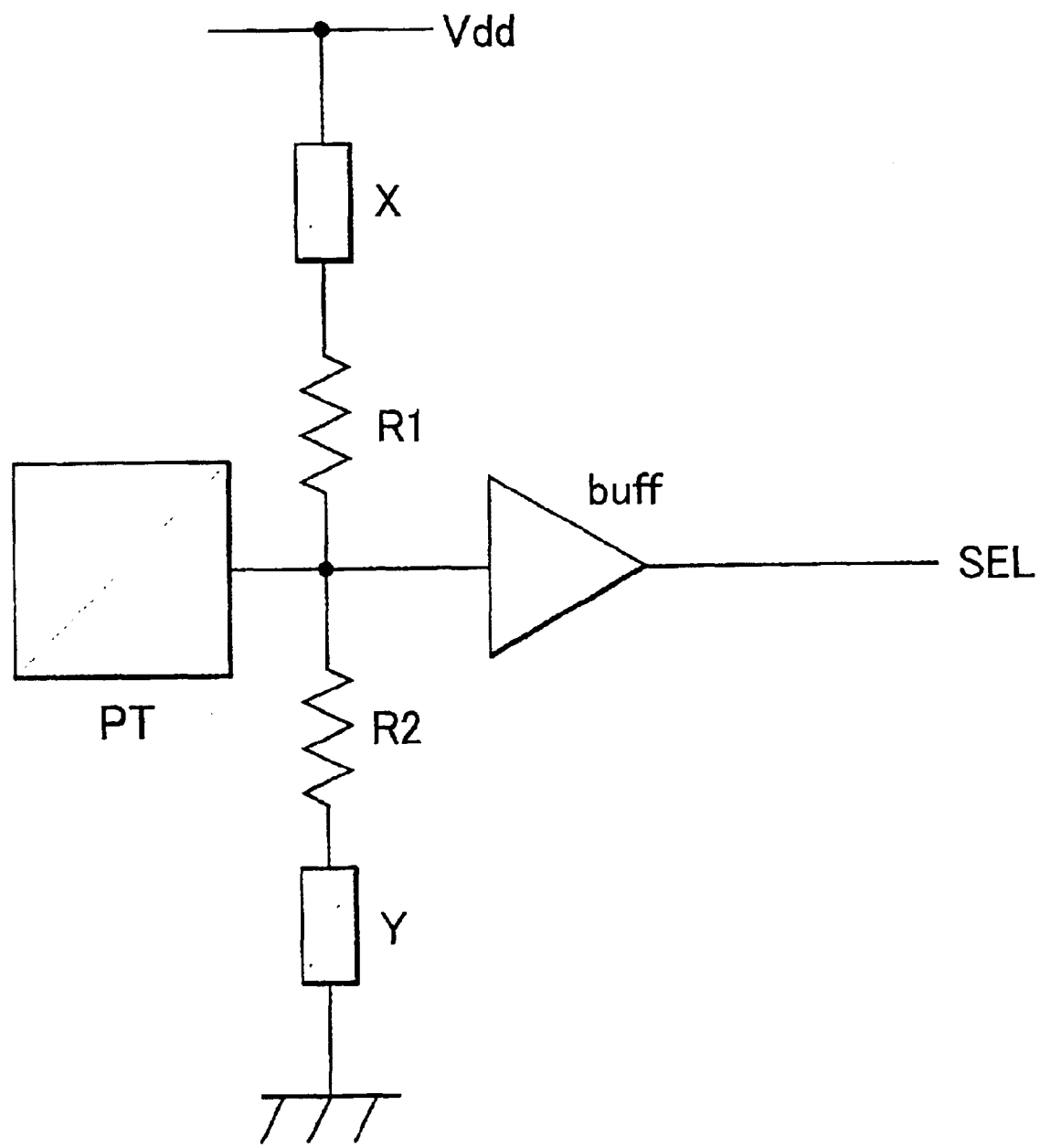
FIG. 4 is a circuit diagram showing a circuit for producing an SEL signal for the circuit in FIG. 3.
Figure 5:
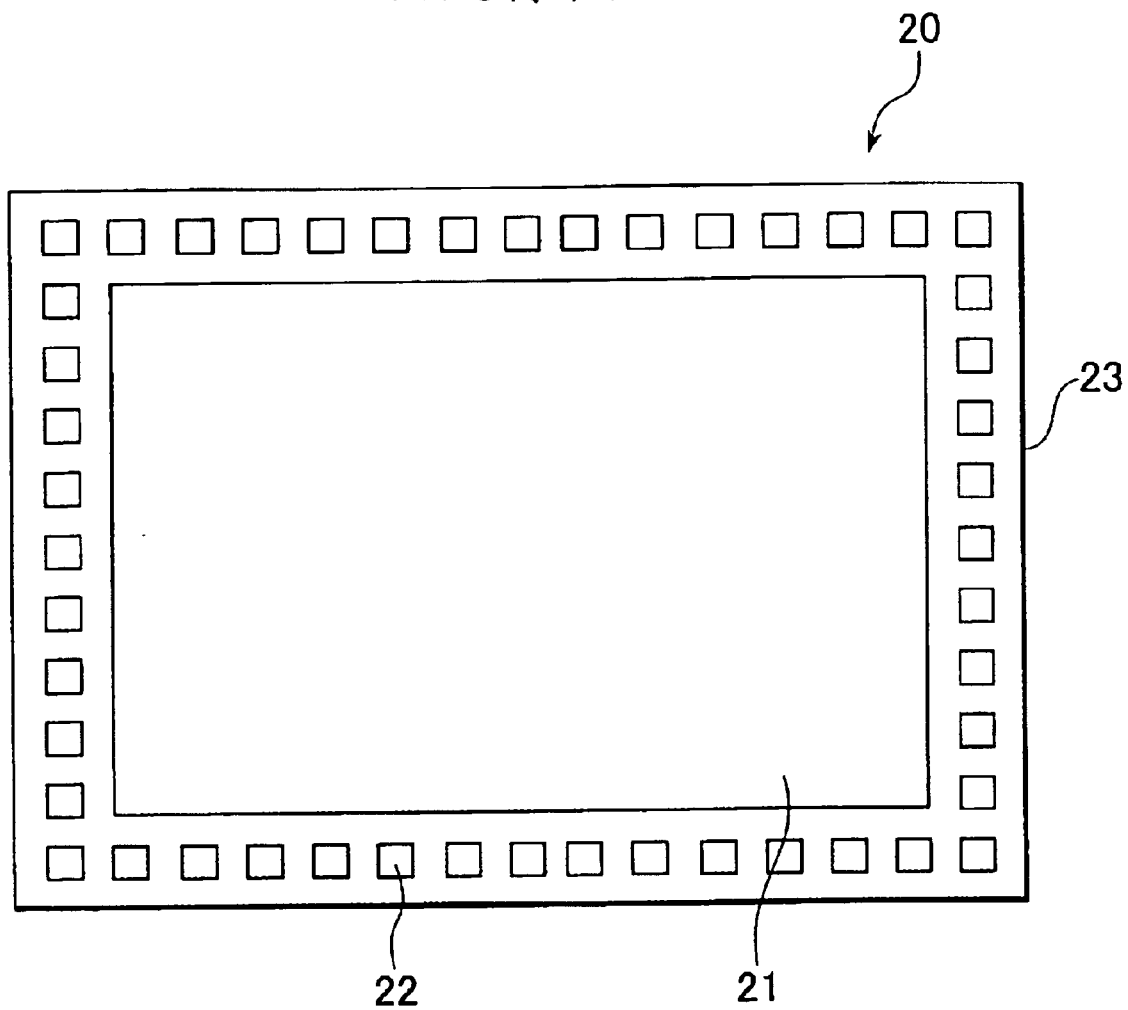
FIG. 5 is a plan view showing a semiconductor chip constituting part of a conventional semiconductor device.

As shown in FIG. 4, an SEL signal for turning on/off each transistor is a signal set on the basis of a signal input from a pad PT which is one of the plurality of input/output pads 14 shown in FIGS. 1 and 2, and the signal input from the pad PT is connected to an input terminal of a buffer circuit buff. The input terminal side of the buffer circuit buff is connected to $V_{dd}$ through a resistor $R_1$ and a fuse X serving as a disconnecting section, and connected to the ground through a resistor $R_2$ and a fuse Y serving as a disconnecting section. The disconnecting section is not limited to such fuse.

The fuse X and the fuse Y are made, for example, from tungsten or aluminum, and can be blown by a laser beam output from a laser repair apparatus. When the fuse X is blown by a laser beam output from a laser repair apparatus. When the fuse X is blown, the SFL signal is is permanently set to HIGH level. When both the fuse Y and the fuse X are blown, the pad PT is released. When neither of the fuse X nor the fuse Y is blown, the SEL signal is set according to the logic level of a signal input from the pad PT.

Continuing description with reference to FIG. 3, common signals are input from pads IN 1, IN2 to the block A and block B. The SEL signal is connected to a gate terminal of the P-channel transistor $T_{pa}$ and connected to a gate terminal of the N-channel transistor $T_{na}$ through an inverter $I_a$ for the block A, while the SEL signal is connected to a gate terminal of the P-channel transistor $T_{pb}$ through an inverter $I_b$ and connected to a gate terminal of the N-channel transistor $T_{nb}$ for the block B. It should be noted that since the block A and block B are formed on the same chip and use the common substrate, the GNDs are common to both blocks and the transistors $T_{na}$, $T_{nb}$ may be removed if a P-type device is used.

When the SEL signal is set to LOW level, both the P-channel transistor $T_{pa}$ and N-channel transistor $T_{na}$ are turned on, power and ground are supplied to the block A and the circuit constituting the block A operates. However, since both the P-channel transistor $T_{pb}$ and N-channel transistor $T_{nb}$ are turned off, power and ground are not supplied to the block B, and the circuit constituting the block B does not operate.

At this point, as a result of the supply of the signal SEL at LOW level to control terminals of tri-state buffers $T_{a1}$, $T_{a2}$ connected to two output terminals $A_{out1}$ and $A_{out2}$ of the block A, both outputs are active (bi-state), and thus outputs from the output terminals $A_{out1}$, $A_{out2}$ of the block A are output as they are to pads OUT 1, OUT 2.

On the other hand, as a result of the supply of the signal SEL at LOW level to control terminals of tri-state buffers $T_{b1}$, $T_{b2}$ connected to two output terminals $B_{out1}$, and $B_{out2}$ of the block B, both outputs are open, and thus outputs from the output terminals $B_{out1}$, $B_{out2}$ of the block B are not output to the pads OUT 1, OUT 2. In other words, when the signal SEL is set to LOW level, only the functions of block A are performed as a whole.

Conversely, when the signal SEL is set to HIGH level, since both the P-channel transistor $T_{pa}$ and N-channel transistor $T_{na}$ are turned off, neither power nor ground is supplied to the block A and thus, the block A does not operate. However, since both the P-channel transistor $T_{pb}$ and N-channel transistor $T_{nb}$ are turned on, power and ground are supplied to the block B, and thus the circuits constituting the block B operate.

At this point, as a result of the supply of the signal SEL at HIGH level to the control terminals of the tri-state buffers $T_{a1}$, $T_{a2}$ connected to the two output terminals $A_{out1}$ and $A_{out2}$ of the block A, both outputs are open, and thus outputs from the output terminals $A_{out1}$, $A_{out2}$ of the block A are not output to the pads OUT 1, OUT 2.

On the other hand, as a result of the supply of the signal SEL at HIGH level to the control terminals of the tri-state buffers $T_{b1}$, $T_{b2}$ connected to the two output terminals $B_{out1}$ and $B_{out2}$ of the block B, both outputs become active (bi-state), and outputs from the output terminals $B_{out1}$, $B_{out2}$ of the block B are output as they are to the pads OUT 1, OUT 2. In other words, when the signal SEL is set to HIGH level, only the functions of block B are performed as a whole.

In this manner, one of the two blocks can be operated and the other block can be prevented from operating only by setting the SEL signal to LOW level or HIGH level. Thus, for example when the block A is found not to operate normally during a test stage, this device can be delivered as a semiconductor device in which only the block B operates by blowing the fuse Y to fix the SEL signal to HIGH level. Conversely, when the block B is found not to operate normally, this device can be delivered as a semiconductor device in which only the block A operates by blowing the fuse X to fix the SEL signal to LOW level.

In addition, when both of the block A and block B are found to operate normally, this device may be delivered with one of the blocks being operable by blowing the fuse X or the fuse Y or with both of the blocks being operable. When both of the blocks are operable, one of the block A and block B is selected by a signal input to the pad PT from an external circuit for operation.

Next, description will be made for the yield when the block A and block B have the same functions. The yield refers to the probability that the device can be delivered as a product with one or both of the two mounted circuits operating normally.

When the block A and block B have the same functions, assuming that a fraction defective of the block A is $P_A$ and a fraction defective of the block B is $P_B$, the probability of the block A operating normally is $(1-P_A)$ and the probability of the block B operating normally is $(1-P_B)$. Thus, assuming that the probability of both blocks operating normally is $G_{oo}$, the following relational expression (1) holds:

$$G_{oo}=(1-P_A)\cdot(1-P_B) \tag{1}$$

Also, assuming that the probability of the block A operating normally and the block B not operating normally is $G_{ox}$, the following relational expression holds:

$$G_{ox}=(1-P_A)\cdot P_B \tag{2}$$

On the other hand, assuming that the probability of the block A not operating normally and the block B operating normally is $G_{xo}$, the following relational expression holds:

$$G_{xo}=P_A\cdot(1-P_B) \tag{3}$$

When the block A and block B have the same functions, $P_A$ is equal to $P_B$ and thus the relational expressions (4), (5), and (6) hold assuming that $P_A=P_B=P$:

$$G_{oo}=(1-P)^2 \tag{4}$$

$$G_{ox}=(1-P)\cdot P \tag{5}$$

$$G_{xo}=P\cdot(1-P) \tag{6}$$

Assuming that the probability of at least one of the block A and block B operating normally is $G_{AB}$, the following relational expression (7) holds:

$$G_{AB}=G_{oo}+G_{ox}+G_{xo} \tag{7}$$

Here, assuming that P=0.15 and when this value is substituted into the expressions (4), (5), and (6) to determine $G_{oo}$, $G_{ox}$, and $G_{xo}$, and the resultant values are substituted into the expression (7), $G_{AB}$ is equal to 0.9775 (97.75%). In other words, the yield is 97.75% when the block A and block B have the same functions.

On the other hand, in a conventional semiconductor device which has only one block with a fraction defective P mounted on one semiconductor chip, the probability G of that block operating normally can be determined by using the following relational expression (8):

$$G=1-P \tag{8}$$

When P is equal to 0.15 similarly to the foregoing, G is equal to 0.85 (85%). Thus, when two blocks having the same functions are mounted on one semiconductor chip, the yield is improved by 12.75% (97.75−85=12.75).

Conventionally, when a circuit does not operate normally due to introduced dust, wafer crack, over-etching or under-etching in processes in manufacturing an LSI, that semiconductor device is discarded. In the present invention, however, a semiconductor device can be delivered if any one of a plurality of mounted circuits operates normally, and the yield can be significantly improved.

In addition, since a no-patterned region on a semiconductor chip can be considerably reduced to effectively utilize a semiconductor constituting a substrate, the utilization ratio for a wafer is significantly increased.

Furthermore, when a plurality of mounted blocks have different functions from one another, one kind of photo-mask can realize a plurality of functions to eliminate the need for forming a number of expensive photo-masks, which allows a reduction in development cost. For a circuit block requiring exacting performance, several kinds of blocks having the same functions and formed with different mask dimensions are mounted such that an optimal block can be selected there-from according to variations in processing possibly involved in manufacturing, thereby making it possible to deliver a product in which only a block having desired performance can operate. This will present a solution when an integration degree becomes higher to impose limitations on processing accuracy in the future.

In semiconductor devices such as SRAMs (Static Random Access Memory) or DRAMs (Dynamic Random Access Memory), to prevent functions of the entire device from being impaired when some of memory cells are defective during manufacturing, a typical approach is to previously provide spare memory cells (redundant circuits) on a chip and to access a spare memory cell instead of the defective memory cell at the time of memory access. This approach is employed to improve the yield of the semiconductor device.

When an attempt is made to improve the yield in a logic LSI with an approach similar to that for a memory element, however, only a defective portion of a circuit cannot be replaced with a spare circuit as in memory cells, and a redundant circuit for supporting the entire logic circuit is required to double the chip size. This is no longer what can be called a redundant circuit, and it is thus substantially impossible to provide a redundant circuit for a logic circuit. For this reason, a redundant circuit has been hardly provided for a logic LSI conventionally, and when a portion of a logic circuit is defective, the entire logic LSI must be discarded.

To address this, since a no-patterned region is created with an increasingly miniaturized LSI in an active region where a circuit can be mounted, the present invention effectively utilizes such a region, which conventionally has been a no-patterned region, by mounting a redundant circuit there. Therefore, even when a portion of a logic circuit is defective, the redundant circuit is caused to function similarly thereto to allow improvement in the yield of the logic LSI.

It goes without saying that while the embodiment has been described for the two blocks mounted on one semiconductor chip, the yield is also improved when three or more blocks are mounted.

What is claimed is:

1. A semiconductor device, comprising:

an I/O region formed on a chip and having at least an input/output pad;

a plurality of active regions formed on said chip, said active regions being separated from one another by a boundary region;

a plurality of logic circuits having either one of the same functions and different functions being mounted in each of said active regions, and a selection circuit for selectively operating only one of said plurality of mounted logic circuits;

wherein each of said plurality of mounted logic circuits is operated by setting an SEL signal for selectively turning a plurality of transistors on and off for each of said mounted logic circuits, to one of a high and a low level.

2. The semiconductor device according to claim 1, wherein said selection circuit selects a logic circuit to be operated on a basis of a signal input supplied through said input/output pad.

3. A semiconductor device comprising:

an I/O region formed on a chip and having at least an input/output pad;

an active region formed on said chip;

a plurality of logic circuits having either one of the same functions and different functions being mounted in said active region, and a selection circuit for selectively operating only one of said plurality of mounted logic circuits;

wherein said selection circuit includes a buffer circuit having a disconnecting section, said buffer circuit being substantially free of transistors and inverters, and said disconnecting section being disconnected to allow permanent setting of an operable circuit.

4. The semiconductor device according to claim 3, wherein said disconnecting section includes a fuse.

5. A semiconductor device comprising:

an I/O region formed on a chip and having at least an input/output pad;

an active region formed on said chip;

a plurality of logic circuits having either one of the same functions and different functions being mounted in said active region, and a selection circuit for selectively operating only one of said plurality of mounted logic circuits;

wherein said selection circuit includes a transistor element connected in series with each said logic circuit between said logic circuit and a power terminal, and said transistor element selects a logic circuit to be operated on a basis of a signal input supplied through said input/output pad.

* * * * *